(12) United States Patent
Kim

(10) Patent No.: US 8,119,487 B2
(45) Date of Patent: Feb. 21, 2012

(54) SEMICONDUCTOR DEVICE AND METHOD FOR FABRICATING THE SAME

(75) Inventor: Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 68 days.

(21) Appl. No.: 12/631,438

(22) Filed: Dec. 4, 2009

(65) Prior Publication Data

US 2010/0155841 A1  Jun. 24, 2010

(30) Foreign Application Priority Data

Dec. 24, 2008 (KR) ........................ 10-2008-0132821

(51) Int. Cl.
*H01L 21/336* (2006.01)
*H01L 29/78* (2006.01)

(52) U.S. Cl. ........ 438/286; 438/270; 438/283; 438/302; 257/175; 257/335; 257/337; 257/338; 257/339; 257/346; 257/E21.409; 257/E21.427; 257/E21.633; 257/E27.064; 257/E29.064; 257/E29.255; 257/E29.268

(58) Field of Classification Search .................. 438/270, 438/283, 286, 302; 257/175, 335, 337, 338, 257/339, 346, E21.409, E21.427, E21.633, 257/E27.064, E29.064, E29.268

See application file for complete search history.

(56) References Cited

U.S. PATENT DOCUMENTS

| 7,910,951 | B2* | 3/2011 | Vashchenko | 257/175 |
| 2004/0026728 | A1* | 2/2004 | Yoshida et al. | 257/303 |
| 2004/0256692 | A1* | 12/2004 | Kunz et al. | 257/500 |
| 2005/0112822 | A1* | 5/2005 | Litwin | 438/270 |

OTHER PUBLICATIONS

US 7,915,677, 03/2011, Huang et al. (withdrawn)*

* cited by examiner

*Primary Examiner* — Dao H Nguyen

(74) *Attorney, Agent, or Firm* — The Law Offices of Andrew D. Fortney; Andrew D. Fortney

(57) ABSTRACT

A Semiconductor device and method for fabricating the same are disclosed. The method includes implanting first conduction type impurities into a semiconductor substrate to form a first well, implanting second conduction type impurities into the first well to form a second well, implanting second conduction type impurities into the second well to form an impurity region, forming a gate on the semiconductor substrate, and implanting second conduction type impurities to form a drain region in the impurity region on one side of the gate.

18 Claims, 3 Drawing Sheets

SEMICONDUCTOR DEVICE AND METHOD FOR FABRICATING THE SAME

CROSS REFERENCE TO RELATED APPLICATION

This application claims the benefit of Korean Patent Application No. 10-2008-0132821, filed on Dec. 24, 2008, which is hereby incorporated by reference as if fully set forth herein.

BACKGROUND OF THE DISCLOSURE

1. Field of the Disclosure

The present invention relates to semiconductor devices, and, more particularly, to a high voltage semiconductor device.

2. Discussion of the Related Art

Circuits used for LSI (large-scale integration) for driving a flat display device, such as LCD (liquid crystal display device), PDP (plasma display panel), OLED (organic light-emitting diode), LSI for automobile, LSI for OA (office automation) and peripheral devices, and a motor driving LSI may have a high voltage device and a low voltage logic device integrated within one chip.

PMIC (Power Management Integrated Circuit) products each having a high voltage device and a low voltage logic device integrated within one chip are developing day by day, and fields of application thereof are increasing.

In general, in order to form a high voltage device, a well forming step is performed and an extended drain region is formed for the high voltage device before a logic device is formed. Or, a well for a logic device can be used together with a well for the high voltage device at one device channel region.

However, the steps for forming the high voltage device can result in an increase in the number of fabrication steps, which is liable to increase a production cost. The use of a well for a logic device together with a well for the high voltage device at one device channel region can cause instability of a device threshold voltage. Moreover, the integration of a high voltage device and a low voltage logic device on one chip may cause limitation in making a device smaller.

SUMMARY OF THE DISCLOSURE

Accordingly, the present invention relates to a high voltage semiconductor device and a method for fabricating the same.

Embodiments of the present invention provide a high voltage semiconductor device and a method for fabricating the same, in which a low density well region and a low density extended drain region are locally formed by adding only one fabrication step to the formation of a drain region of a logic device, providing a local low density well thereto.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structures particularly pointed out in the written description and claims hereof as well as the appended drawings.

To achieve these objects and other advantages and in accordance with the purpose of the invention, as embodied and broadly described herein, a method for fabricating a semiconductor device may include the steps of implanting first conduction type impurities into a semiconductor substrate to form a first well, implanting second conduction type impurities into the first well, to form a second well, implanting second conduction type impurities into the second well to form an impurity region, forming a gate on the semiconductor substrate, and implanting second conduction type impurities to form a drain region in the impurity region on one side of the gate.

In another aspect of the present invention, a semiconductor device may include a first well in a semiconductor substrate having the first conduction type and a first impurity concentration, a second well in the first well having a first conduction type and a second impurity concentration, an impurity region in the second well having a second conduction type and a third impurity concentration, a gate insulating film and a gate electrode on the semiconductor substrate, and a drain region in the impurity region on one side of the gate electrode, having the first conduction type and a fourth impurity concentration.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principles of the disclosure. In the drawings.

DETAILED DESCRIPTION

Reference will now be made in detail to embodiments of the present invention, examples of which are illustrated in the accompanying drawings. Wherever possible, the same reference numbers will be used throughout the drawings to refer to the same or like parts.

FIGS. 1A~1E illustrate cross-sections showing a method for fabricating a semiconductor device in accordance with embodiments of the present invention.

Figure 1A:
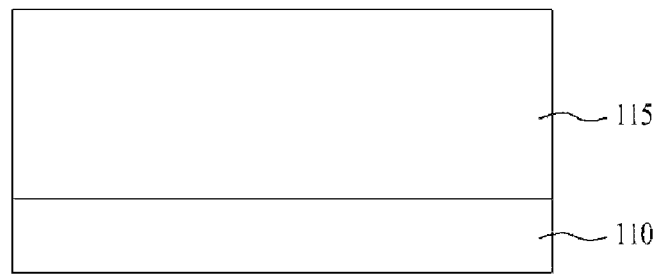
FIGS. 1A~1E illustrate cross-sections showing the steps of an exemplary method for fabricating a semiconductor device in accordance with embodiments of the present invention.
Figure 1B:
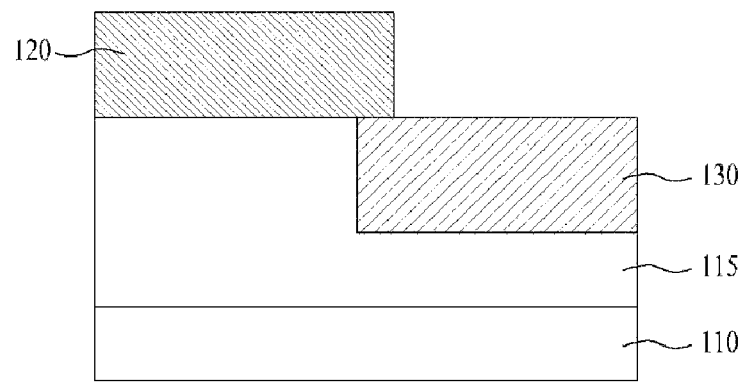

Referring to FIG. 1A, a first implanting is performed by injecting first conduction type impurities into a semiconductor substrate to form a high concentration first conduction type well 115 in the semiconductor substrate 110. The semiconductor substrate 110 can have a first conduction type or a second conduction type. An impurity concentration of the semiconductor substrate 110 can be, for example, below $5E16$ atoms/cm$^2$, and an impurity concentration of the high concentration first conduction type well 115 can be, for example, between $5E16$~$1E18$ atoms/cm$^2$ (or any value therein).

The first conduction type can be a p type and the second conduction type can be an n type. However, the invention is not so limited, and the first conduction type can be an n type and the second conduction type can be a p type.

Then, the semiconductor substrate 110 having the first well 115 formed therein may be subjected to photolithography to form a first photoresist pattern 120 which exposes a portion of the semiconductor substrate 110. A second implanting may be performed for injecting second conduction type impurities into the first well 115 using the first photoresist pattern 120 as a mask, to form a second well 130 in the first well 115.

For example, if a dose or concentration of second conduction type impurities lower than the concentration or dose in the first conduction type well 115 is injected at high energy, the second well 130 can be formed in the first well 115, having an effective concentration of the first conduction type impurities lower than a concentration of the first conduction type impurities in the first well 115 by compensation. In this instance, it is possible that the first conduction type well 130 having a lower effective dopant concentration can be formed by a tilted ion injection using the first photoresist pattern 120 as a mask. By means of the tilted ion injection of second conduction type impurities, a width of the second well 130 can be fixed.

Figure 1C:
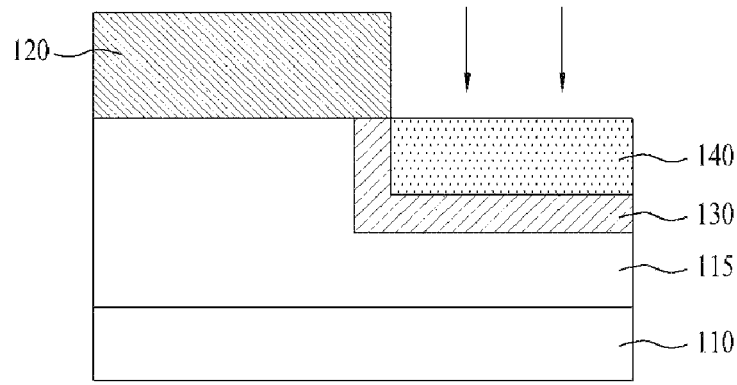

Referring to FIG. 1C, a third implanting may be performed by injecting second conduction type impurities into the second well 130 using the first photoresist pattern 120 as a mask to form a second conduction type impurity region 140. The third implanting may have an ion injection energy lower than the ion injection energy of the second implanting. Then, the first photoresist pattern 120 is removed by asking (e.g., using an oxygen-based plasma) or chemical stripping.

Figure 1D:
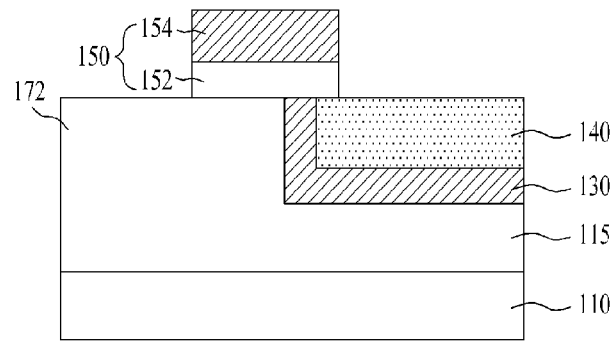

Referring to FIG. 1D, a gate 150 is formed, having a gate insulating film 152 and a gate electrode 154 formed in succession on the semiconductor substrate 110 having the first well 115, the second well 130, and the impurity region 140 formed therein. Generally, gate 150 is formed by wet or dry thermal oxidation of the surface of substrate 110 to form a gate oxide layer, then a polysilicon film is formed thereon by, e.g., chemical vapor deposition (CVD) of silicon (e.g., from a silicon source such as silane) and annealing, and the gate oxide film 152 and gate electrode 154 are defined by photolithographic patterning and etching.

The gate 150 may be formed on the first well 115 to overlap with the second well 130 and the impurity region 140 respectively.

In an alternative embodiment (not shown), the gate 150 may be formed on the first well 115, not to overlap with the impurity region 140, but to overlap with the second well 130, partly.

Figure 1E:
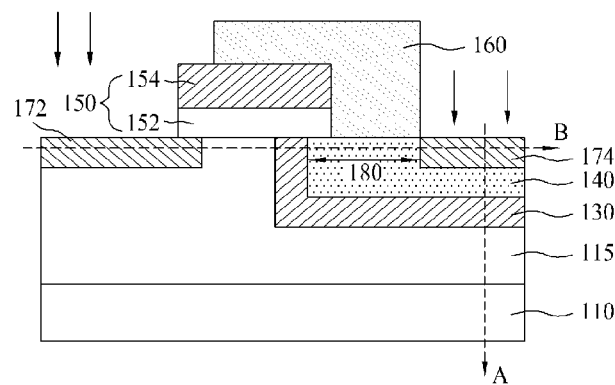

Referring to FIG. 1E, photolithography may be performed, to form a second photoresist pattern 160 on the semiconductor substrate 110 having the gate 150 formed thereon. The second photoresist pattern 160 may cover a portion of the impurity region 140 adjacent to the gate 150 and expose the other portion of the impurity region 140.

Then, a fourth implanting may be performed to inject second conduction type impurities using the second photoresist pattern 160 as a mask, to form a source region 172 and a drain region 174 on opposite sides of the gate 150.

That is, the source region 172 is formed in a surface of the first well 115 on one side of the gate 150, and the drain region 174 is formed in the exposed portion of the impurity region 140 on an opposite side of the gate 150. After formation of the source region 172 and the drain region 174, the second photoresist pattern 160 is removed, generally by plasma asking and/or wet cleaning.

In order to adjust a breakdown voltage of the high voltage device, the drain region 174 can be formed in a surface of the impurity region spaced a predetermined or target distance away from the gate 150, to form an extended drain region 180 of a low concentration.

Referring to FIG. 1E, a semiconductor device in accordance with embodiments of the present invention includes a first well 115 formed in a semiconductor substrate 110 having a first impurity concentration, a second well 130 in the first well 115 having a second impurity concentration, an impurity region 140 in the second well 130 having a third impurity concentration, a gate on the semiconductor substrate 110, a drain region 174 having a fourth impurity concentration in the impurity region 140 on one side of the gate 150, and a source region 172 in the first well 115 on an opposite side of the gate 150.

The effective impurity concentration in region 130 may be lower than the impurity concentration in region 115. The drain region 174 may be spaced a predetermined or target distance away from the gate 150 for adjusting the breakdown voltage.

Figure 2:
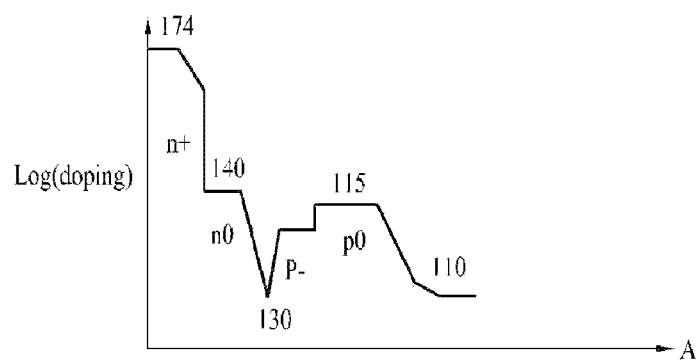
FIG. 2 illustrates a graph showing a vertical doping profile of the semiconductor device in FIG. 1E.
Figure 3:
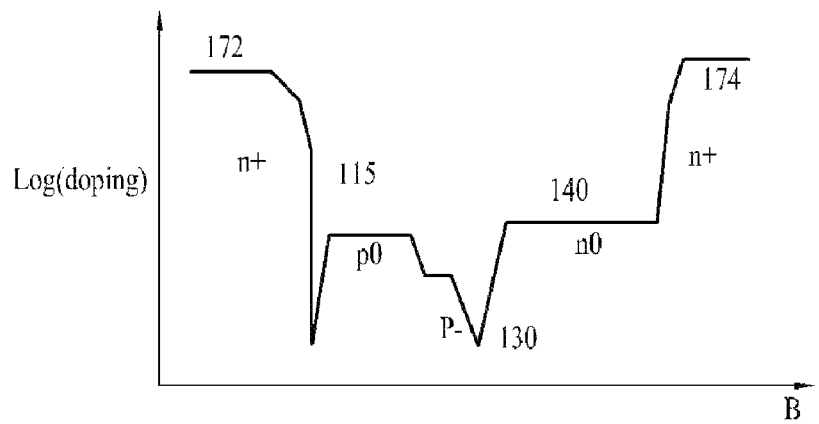
FIG. 3 illustrates a graph showing a horizontal doping profile of the semiconductor device in FIG. 1E.

FIG. 2 is a graph showing a vertical doping profile of the semiconductor device in FIG. 1E, and FIG. 3 is a graph showing a horizontal doping profile of the semiconductor device in FIG. 1E.

Referring to FIG. 2, the drain region 174 may have an impurity concentration (n+) higher than an impurity concentration (n0) of the impurity region 140, and the first well 115 may have an impurity concentration (P0) higher than an impurity concentration (P−) of the second well 130. As shown in FIG. 3, the source region 172 may have a concentration (n+) about the same as an impurity concentration of the drain region 174.

Figure 4:
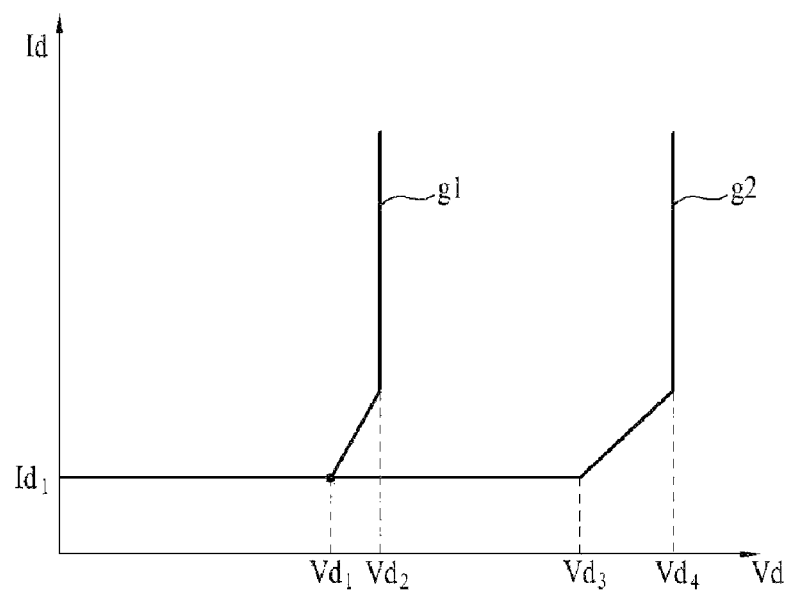
FIG. 4 illustrates a graph showing a characteristic of a drain current vs. voltage for each of a logic device and a high voltage device.

FIG. 4 is a graph showing a characteristic of a drain current vs. voltage for each of an exemplary logic device and an exemplary high voltage device. A first graph (g1) shows the drain current vs. voltage of the logic device, and the second graph (g2) shows the drain current vs. voltage of the high voltage device in accordance with embodiments of the present invention.

Referring to FIG. 4, drain currents Id1 of the logic device and the high voltage device may be constant when drain voltage Vd is low (Vd<Vd1). However, if the drain voltage Vd exceeds a first voltage Vd1, the drain current of the logic device increases gradually until drain voltage Vd reaches a second voltage Vd2, when the drain voltage is abnormally high and causes the logic device to break down. However, even if the drain voltage Vd reaches to second voltage Vd2, the drain current Id1 of the high voltage device is constant. However, if the drain voltage is higher than a third voltage Vd3, the drain current of the high voltage device also increases gradually until the drain voltage reaches a fourth voltage Vd4, when the drain voltage Vd is abnormally high and causes the high voltage device to break down.

As has been described, the semiconductor device and methods for fabricating the same of the present invention may have the following advantages.

The semiconductor device and methods for fabricating the same of the present invention may enable fabrication of a high voltage device employing one additional mask and ion injection step, and a small sized high voltage device enabling suppression of punch through between the drain and the source.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising:
   implanting first conduction type impurities into a semiconductor substrate to form a first well having a first conduction type;
   implanting second conduction type impurities into the first well to form a second well having said first conduction type;
   implanting second conduction type impurities into said second well, to form a second conduction type impurity region;
   forming a gate on the semiconductor substrate; and
   implanting second conduction type impurities in the second conduction type impurity region on one side of the gate,
   wherein an effective impurity concentration of the second well is lower than the first impurity concentration of the first well.

2. The method as claimed in claim 1, wherein implanting second conduction type impurities into the first well to form a second well includes:
   forming a first photoresist pattern on the semiconductor substrate having the first well therein, and
   implanting the second conduction type impurities using the first photoresist pattern as a mask to form the second well.

3. The method as claimed in claim 2, wherein implanting second conduction type impurities into the second well to form the second conduction type impurity region includes using the first photoresist mask to form the second conduction type impurity region.

4. The method as claimed in claim 1, wherein implanting second conduction type impurities into the first well to form the second well includes tilted injection of the second conduction type impurities using the first photoresist pattern as mask.

5. The method as claimed in claim 1, further comprising forming a source region in the first well on an opposite side of the gate relative to the second well.

6. The method as claimed in claim 1, wherein the drain region is spaced a predetermined distance away from the gate, sufficient to control a breakdown voltage of said semiconductor device.

7. The method as claimed in claim 1, wherein the first well has an impurity concentration higher than an effective impurity concentration of the second well.

8. The method of claim 1, wherein forming the gate on the semiconductor substrate comprises:
   forming a gate dielectric layer on said substrate; and
   forming a gate electrode thereon.

9. The method of claim 1, wherein said gate overlaps said second well and said second conduction type impurity region.

10. The method of claim 1, wherein said gate at least partially overlaps said second well.

11. The method of claim 1, wherein implanting said second conduction type impurities in said second conduction type impurity region includes:
    forming a second photoresist pattern on the semiconductor substrate having the gate thereon, and
    implanting the second conduction type impurities using the second photoresist pattern as a mask to form a drain region.

12. The method of claim 1, wherein said first conduction type is p-type and said second conduction type is n-type.

13. A semiconductor device, comprising:
    a first well in a semiconductor substrate having a first conduction type and a first impurity concentration;
    a second well in the first well having the first conduction type and a second impurity concentration;
    a second conduction type impurity region in the second well having a third impurity concentration;
    a gate insulating film and a gate electrode on the semiconductor substrate; and
    a drain region in the second conduction type impurity region having a second conduction type and a fourth impurity concentration, wherein the fourth impurity concentration is different from the third impurity concentration, and
    wherein an effective impurity concentration of the second well is lower than the first impurity concentration of the first well.

14. The semiconductor device as claimed in claim 13, wherein the drain region is formed spaced a predetermined distance away from the gate electrode.

15. The semiconductor device as claimed in claim 13, further comprising a source region in the first well on an opposite side of the gate electrode relative to the second well.

16. The semiconductor device of claim 13, wherein said gate insulating film and gate electrode overlap said second well and said second conduction type impurity region.

17. The semiconductor device of claim 13, wherein said gate insulating film and gate electrode at least partially overlap said second well.

18. The semiconductor device of claim 13, wherein said first conduction type is p-type and said second conduction type is n-type.

* * * * *